United States Patent [19]
Cox et al.

[11] 3,936,812
[45] Feb. 3, 1976

[54] SEGMENTED PARALLEL RAIL PATHS FOR INPUT/OUTPUT SIGNALS

[75] Inventors: Dennis T. Cox, Kingston; William T. Devine, Ulster Park; Gilbert J. Kelly, Red Hook, all of N.Y.

[73] Assignee: IBM Corporation, Armonk, N.Y.

[22] Filed: Dec. 30, 1974

[21] Appl. No.: 537,218

[52] U.S. Cl. ......... 340/173 R; 235/152; 340/173 SP
[51] Int. Cl.² ...................... G11C 5/02; G11C 5/06
[58] Field of Search ....... 340/173 SP, 166 R, 173 R; 235/152

[56] References Cited
UNITED STATES PATENTS
3,761,902   9/1973   Weinberger ................. 340/173 AM OTHER PUBLICATIONS
Cook et al. Comparison of MOSFET Logic Circuits, IEEE Journal of Solid-State Circuits, Vol. SC-8, No. 5, 10/73.

*Primary Examiner*—Stuart N. Hecker
*Attorney, Agent, or Firm*—James E. Murray

[57] ABSTRACT

This specification describes an orderly arrangement of input and output lines for a programmable logic array chip (PLA). In the arrangement, a plurality of parallel current conducting lines called rails are positioned on the chip along side the arrays of the PLA. The inputs and outputs of the arrays are selectively connected to individual rails so that the rails carry the input signals to the arrays from off the chip and take output signals of the arrays off the chip and to inputs of the arrays. The rails are selectively segmented so that each segment of a rail may be used as a path for an input and/or output signal without interfering with signals on other segments of the same rail.

8 Claims, 11 Drawing Figures

FIG. 3
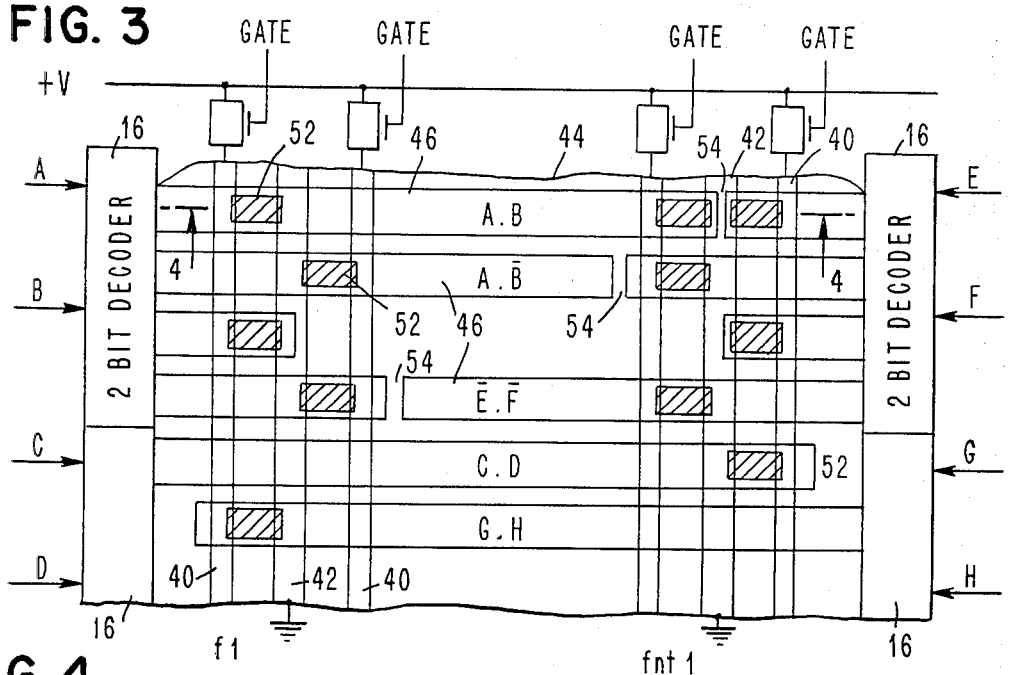
FIG. 4
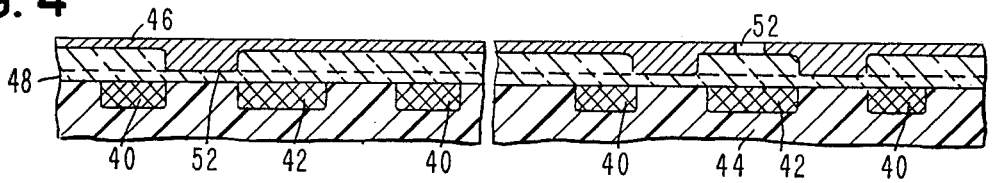
FIG. 2
| A.B | A.B̄ | Ā.B | Ā.B̄ | PRODUCT TERM FUNCTION FORMED |
|---|---|---|---|---|
| 0 | 0 | 0 | 0 | DON'T CARE |
| 0 | 0 | 0 | 1 | A + B |
| 0 | 0 | 1 | 0 | A + B̄ |
| 0 | 0 | 1 | 1 | A |
| 0 | 1 | 0 | 0 | Ā + B |
| 0 | 1 | 0 | 1 | B |
| 0 | 1 | 1 | 0 | A = B |
| 0 | 1 | 1 | 1 | A.B |
| 1 | 0 | 0 | 0 | A + B̄ |
| 1 | 0 | 0 | 1 | A ⊕ B |
| 1 | 0 | 1 | 0 | B̄ |
| 1 | 0 | 1 | 1 | A.B̄ |
| 1 | 1 | 0 | 0 | Ā |
| 1 | 1 | 0 | 1 | Ā + B |
| 1 | 1 | 1 | 0 | Ā.B̄ |
| 1 | 1 | 1 | 1 | FALSE |
NEVER USED →

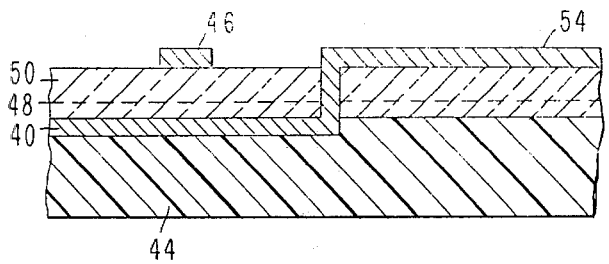
FIG. 5
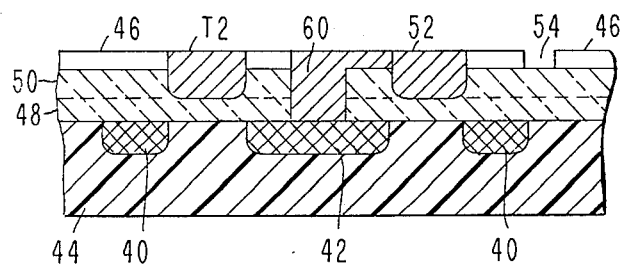
FIG. 8
FIG. 6
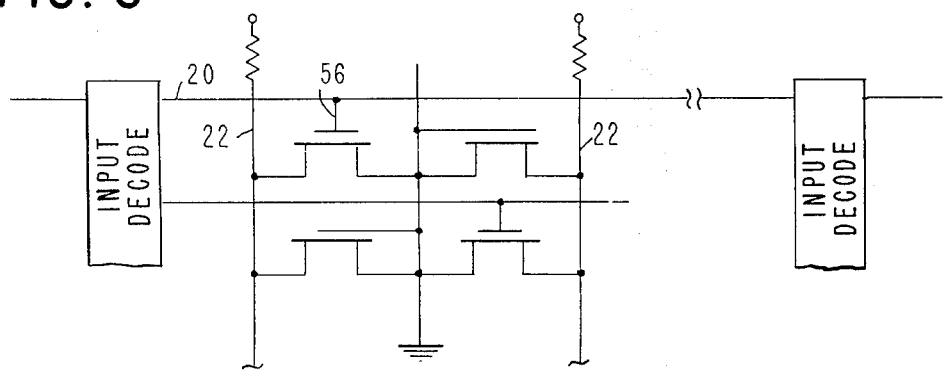
FIG. 7
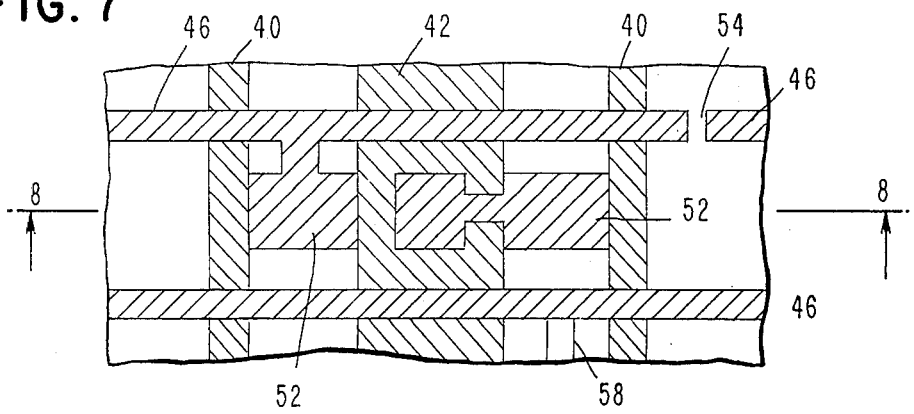

SEGMENTED PARALLEL RAIL PATHS FOR INPUT/OUTPUT SIGNALS

BACKGROUND OF THE INVENTION

The present invention relates to arrays for performing logic functions and more particularly it is related to an orderly arrangement of input and output lines for such arrays.

The performing of logic in an array of identical circuit elements each located at a unique intersection of an input and output line in a grid of intersecting input and output lines is well known. It is also well known to perform logic in a compound arrangement of these arrays called a programmable logic array chip (PLA) by using the outputs of one array as the inputs to another array. Co-pending U.S. patent application Ser. No. 537,219 filed on even date herewith describes such a PLA on which a number of decoders feed inputs to a first array called a product term generator or an AND array which in turn supplies outputs to a second array called a sum of product term generator or an OR array. The outputs of the OR array are then used to control the setting and resetting of a string of latches so that both combinatorial and sequential logic functions can be performed by the PLA. The particular logic functions actually performed by the given PLA are controlled by the locations and number of the active logic circuits in the AND and OR arrays of the PLA and also by how inputs are supplied to the decoders either from off the chip or from the latches. For this and other reasons the external connections to the decoders and latches change with the functions performed by the PLA. As a result, the advantages that array logic has in design and manufacturing of monolithic chips containing logic performing circuits cannot be fully realized unless the arrangement used in making the external connections to the arrays is flexible and effects a minimum number of processing steps in manufacturing of the monolithic chip.

THE INVENTION

Therefore, in accordance with the present invention an orderly and flexible arrangement of making connections to the decoders and from the latches is provided. A plurality of rails are arranged at right angles to lines connected to the inputs of the decoder and the outputs from the latches. The rails are selectively connected to the lines and to other lines for taking signals to and from the chip pads. The rails are split into segments, to isolate signals carried on the same rail from one another. Thus it can be seen that the rail system can be adapted to the variety of connection arrangements necessitated by different logic function configurations of the array logic chips since the positions of the breaks in the rails and the connections between the rails and lines may change for each different adaptation.

In the preferred embodiment of the invention, the rails are each made up of a string of spaced metal portions formed on top of the oxide layer of the chip that are joined together by diffusions into the substrate of the chip under the oxide layer. The connections to the inputs and outputs of arrays are metal lines on top of the oxide layer that pass over the diffusions of some of the rails to connect to a metal portion of another. This arrangement permits connections between the rails and the lines and the positions in breaks on the rails to be changed by changing the metal pattern on the surface of the oxide layer. Thus, this interconnection scheme is fully compatible with metal personalization or metal-gate personalization of the arrays since it allows the manufacturing steps of all the chips to be the same up until the laying out of the metallization. After that the manufacturing steps would differ only insofar as the pattern laid down in the metallization step would differ from chip to chip.

Therefore, it is an object of the present invention to provide an orderly arrangement of input and output lines to and from logic arrays.

Another object of the present invention is to provide an orderly connection scheme that can be used for the varieity of different connection arrangements needed for different configurations of an array logic chip.

A further object of the invention is to provide a connection scheme for making connections to and from array logic chips that requires a minimum of design and manufacturing time to adapt to a variety of different input and output connection arrangements.

THE DRAWINGS

These and other objects, features and advantages of the invention will be apparent from the following more particular description of the preferred embodiments of the invention of which:

FIG. 2 is a chart of the logic functions that can be performed on any two input variables in the programmed logic array chip of FIG. 1;

FIG. 3 is a plan view showing in more detail the layout of the AND array in FIG. 1;

FIG. 4 is a sectional view taken along line 4—4 in FIG. 3;

FIG. 5 is a sectional view taken through a via hole in an array module layed out in accordance with the schematic of FIG. 1;

FIG. 6 is an electrical schematic of an alternate layout scheme for the AND array in FIG. 1;

FIG. 7 is a plan view of the layout for the schematic of FIG. 6;

FIG. 8 is a sectional view taken along line 8—8 in FIG. 7;

DETAILED DESCRIPTION

Figure 1:
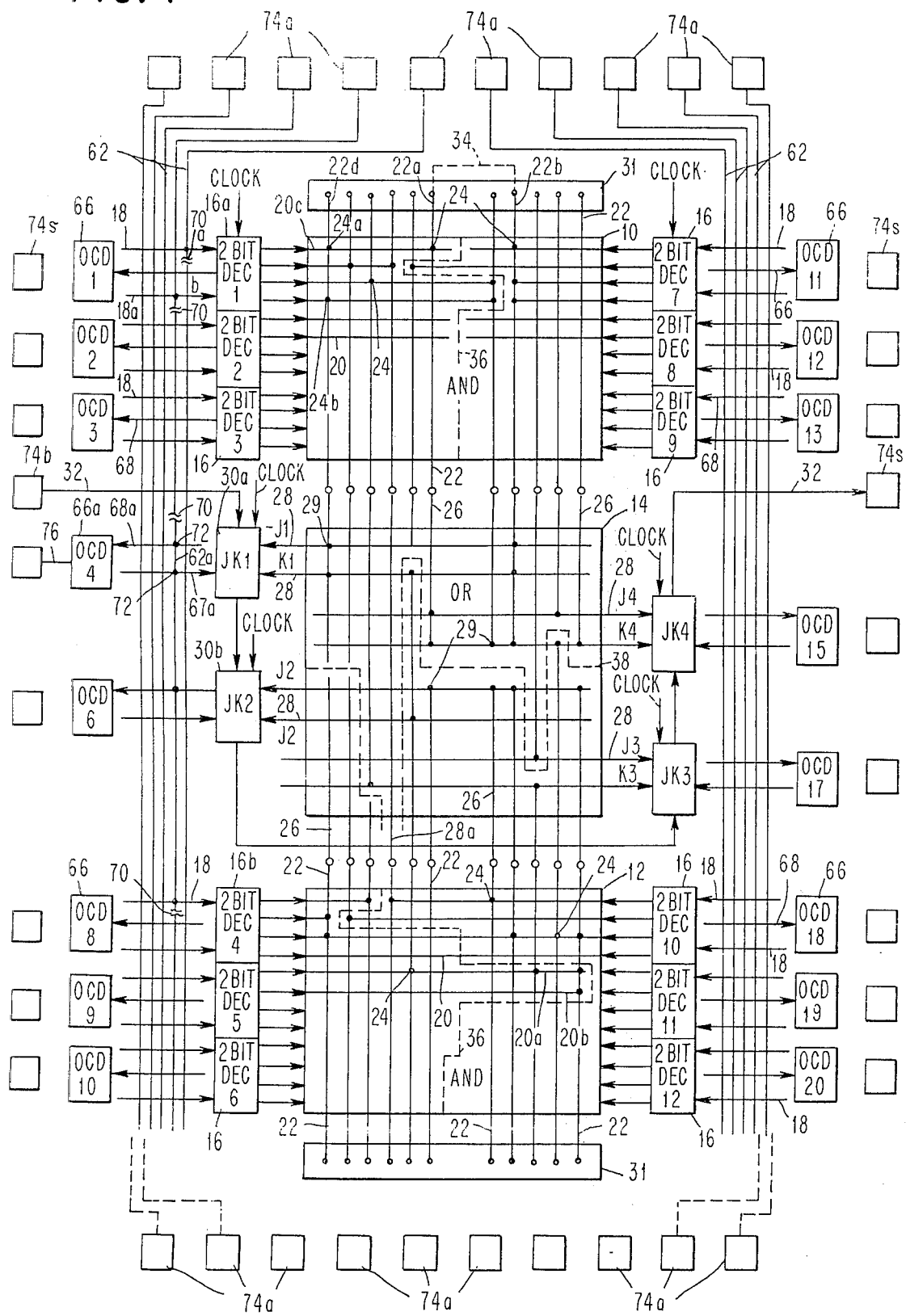
FIG. 1 is a schematic representation of a layout for a programmed logic array chip incorporating the present invention.
Figure 9:
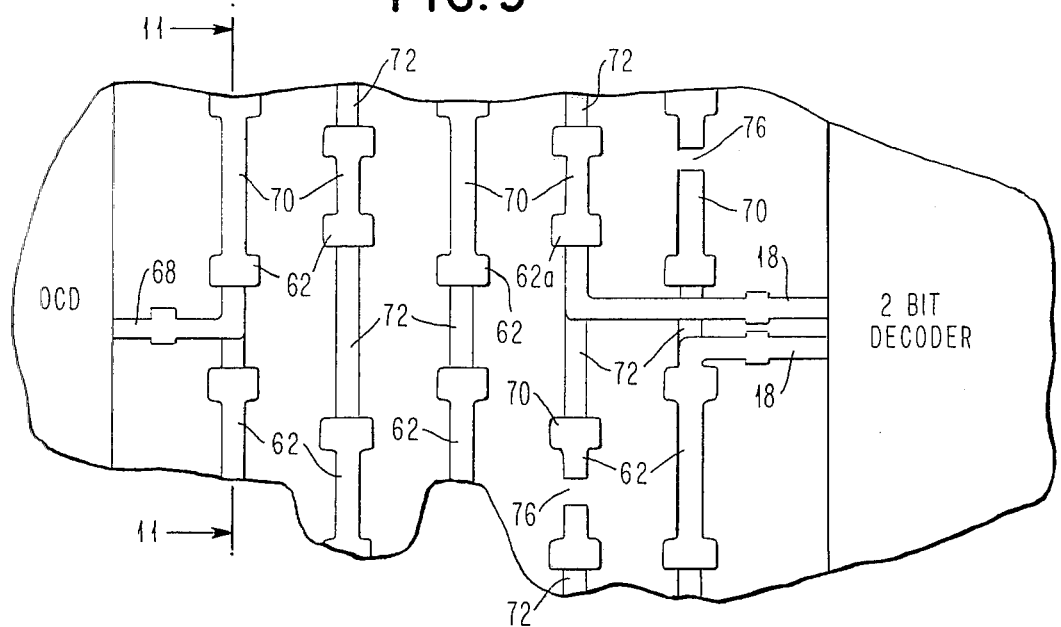
FIGS. 9 and 10 are more detailed plan views of the system of rails shown in FIG. 1; and, FIG. 11 is a section taken along line 11—11 in FIG. 9.

Referring now to FIG. 1, two AND arrays 10 and 12 are located on opposite sides of an OR array 14. Each of the AND arrays 10 and 12 is connected to a plurality of two bit input decoders 16 located on both sides of the AND arrays. These decoders 16 provide four output combinations of two input variables. The decoders 16 receive input variables on input lines 18 and feed each one of its four output combinations of two variables to a different input line 20 in the arrays 10 and 12. Because each input line 20 is connected to two different decoders 16 it can receive two different combinations of two variables.

Arranged orthogonally with respect to the input lines 20 are a plurality of parallel output lines 22 that form a grid with the input lines. Located at intersections of the input and output lines 20 and 22 are logic performing devices 24 that will perform a logical operation, in this case an AND operation, on data placed on the input lines 20 and provide the resultant on the output line 22.

The output lines 22 of the AND arrays 10 and 12 are connected to the input lines 26 for the OR array 14 positioned between the two AND arrays. These input lines 26 intersect the output lines 28 of the OR array. Located at these intersections are logic producing elements 29 that perform an OR function with respect to the signals received from the AND arrays and provide the resultant on the output lines 28. The output lines 28 supply set and reset inputs to a plurality of JK latches 30 which are joined in shift register fashion so that data cannot only be placed in each latch 30 from the OR array but can also be placed onto line 32 from some external source and shifted from one latch to another.

As can be seen, logical functions can be performed on the inputs to the two bit decoders in the two bit decoders 16, the AND arrays 10 and 12, the OR array 14 and the JK latches 30. The different logical functions that can be performed in the decoders 12 and the AND arrays 10 on any two inputs $a$ and $b$ to one of the decoders 12$a$ is shown in FIG. 2. Each column in the chart of FIG. 2 represents one of the four input lines 16 connected to an output of the decoder 12$a$. The headings on any column of this chart is the function performed by the decoder 12$a$ on the inputs $a$ and $b$ in placing an interrogation signal on the input line 20 represented by that column. The rows of the chart represent output lines of the array. The legend on each row indicates the logical function that will be placed on the output line 22 represented by that row, when the input lines of the array, marked by $a$ ′ binary "1" in their columns along that row, are ANDed together by coupling those input lines to that output line 18 with logic performing elements 20. For instance, the Exclusive OR function of $a$ and $b$ is placed on output line 22$d$ when input lines 20$c$ and 20$d$ are connected to it by the logic elements 24$a$ and 24$b$. Performing logic operations using arrays and two bit decoders in this manner is well known and can be found in Weinberger U.S. Pat. No. 3,761,902, dated Sept. 25, 1973. A number of other functions are performed in this array 10 besides the Exclusive OR function. These involve interrogation signals from decoders on both the right and left hand side. When they involve the same input lines they are separated by breaks in the input lines from functions being performed on the right hand side. A dotted line 36 down through these breaks indicates the separation of arrays 10 and 12 into portions performing functions involving the input variables to the left hand decoders and in those involving input variables to the right hand decoders. Similarly the lower array is divided by a dotted line 36 along the breaks in the input lines. However, it should be noted that the input lines 20 are not always broken. They continue completely across the array such that lines 20$a$ and 20$b$ do when they are involved in performing functions on inputs to either but not both the left or the right decoders. Some times it is desirable that functions fed to opposite ends of the same input line 20$c$ be ANDed. This is accomplished within terminal boxes 32 at each end of the AND arrays 10 and 12 by providing a connection 34 between two output lines 20$a$ and 22$b$ to which the input line 20$b$ is coupled by logic performing elements 24$a$ and $b$.

Like in the AND arrays, the input lines 26 of the OR array are broken to separate functions performed on input variables received from the top AND array 10 from functions performed on input variables received from the bottom AND array 12$a$. Dotted line 38 has been placed through the OR array to show how the space in the OR array is divided up between those performing logical functions on inputs from the top AND array and those performing logical functions on inputs from the bottom AND array. It should be noted that line 28$a$ extends all the way through the OR array so that it performs a logical function on input variables supplied both in the top and bottom arrays. This may be desired in some cases.

By examining the dotted lines 36 and 38 it can be seen that the use of the arrays is more intense than it would be if all the inputs were on one side of the array. First of all if all the inputs were on one side, there would not be double use of input lines. In other words, portions of input lines not used to perform functions involving one set of input variables could not be used to perform functions involving another. Also if the decoders were all placed on one side of the line and the two AND arrays were added together, the length of the output lines would have to be extended considerably and larger portions of these output lines would be unuseable. For instance, output line 22$d$ involved in line performing an Exclusive OR of inputs $a$ and $b$ to the first decoder 16$a$ would be 4 times as long if all twelve decoders 16 of the two AND arrays 10 and 12 were placed on one side of a single array and therefore would have 4 times as much unuseable area of the chip arranged along it than is in the arrangement shown in FIG. 1. In the same, division of the OR array increases the amount of unused area on the chips. FIGS. 3 and 4 show how the AND arrays 10 and 12 can be fabricated in FET technology using a combination of gate and metal personalization of the array. A number of diffusion stripes 40 and 42 are the source and sink diffusions for FET's which are the logic performing elements 24 of the array. In addition the diffusions 40 serve as the output lines 22 of the array. The input lines 20 of the array are metal stripes arranged at right angles to the diffusions 40 and 42 on top of thin and thick layers 48 and 50 of oxide that decouple the lines. Whenever a logic function is to be performed at the intersection a gate metalization 52 is placed over a set of diffusions 40 and 42 on the thin metal oxide layer 48 and under one of the metal stripes. Where there is no logic function to be performed at the intersection of a particular input line and output line no such gate metalization pattern is placed between the stripes 40 and 42.

As can be seen from FIGS. 3 and 4, breaks 52 occur in the metal stripes between functions performed on one side of the stripes and functions performed on the other side of the stripes. Thus, it is quite apparent with this technique that the manufacturing steps of all the chips would be the same until the point of laying out the gates and metalization. The chip can then be personalized to perform the desired logic that is to be performed at an intersection and providing for breaks in the line where functions are performed on opposite ends of the same line.

In the completed chip, each metal line 46 becomes the input to an FET logic circuit in which the gate metalization 52 is the gate of an FET having a source connected by diffusion stripe 40 to some positive voltage +V and connected to ground by diffusion stripe 42. When a signal is received from the decoders 16 on metal stripes 48 it biases each FET connected there to conductive for providing a path to ground on changing the voltage on the diffusion stripe 40 or output line 32 from +V to ground. Since the outputs of the decoders are the negative of the inputs to the decoders a logical AND function is performed in the arrays 10 and 12 on the outputs of the decoders.

The OR array 14 is quite similar to the AND array except the OR array is arranged with the metal stripes vertically and the diffusion stripes horizontally. Furthermore, the output of the AND array is positive with respect to the input of the decoders so that an OR function is performed in the OR array on the outputs of the AND arrays. To make the connection between the AND arrays and the OR arrays, one of the metal stripes 56 in the OR array connects to one of the diffusions 40 in the AND array by way of a metalized via hole 54 through the oxide layers 48 and 50.

While a gate-metal personalization is desirable in some cases, there are other situations in which it is desirable to have circuit arrangement in which logic can be changed by a purely metal personalization process. Such an arrangement is shown in FIG. 6. In the embodiment of FIG. 6, each of the intersections of input and output lines 20 is populated by an FET 24 for performing logic. Whether the FET is functioning or not depends on how its gate is connected. If the FET 24 is not being used its gate is grounded to hold the FET biased off. If the FET 24 is being used to perform logic, its gate is connected to one of the input lines 22 to allow the FET to be rendered conducting or nonconducting by the pulses placed on the input line 20. As shown in FIGS. 7 and 8, each FET is provided with a gate and metal connections 58 are selectively made from the gates 52 to the metal stripes 46 or to a diffusion stripes 42 through a via connection 10 in one processing step. It should be understood that the invention is not limited to either one of the above personalization techniques and can be applied equally as well to a number of technologies. In particular, it can be applied to bi-polar technology instead of the described FET technology.

Figure 10:
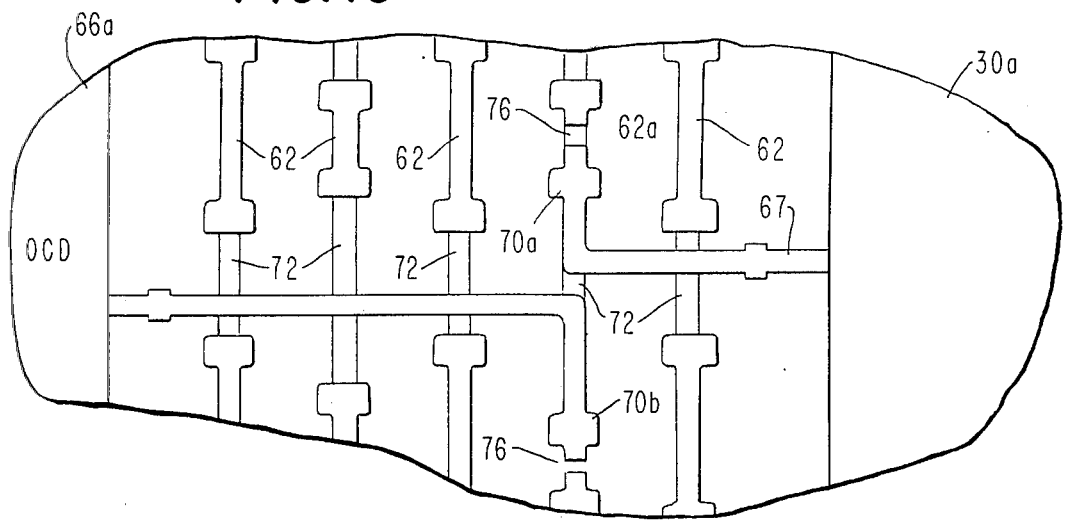
Figure 11:
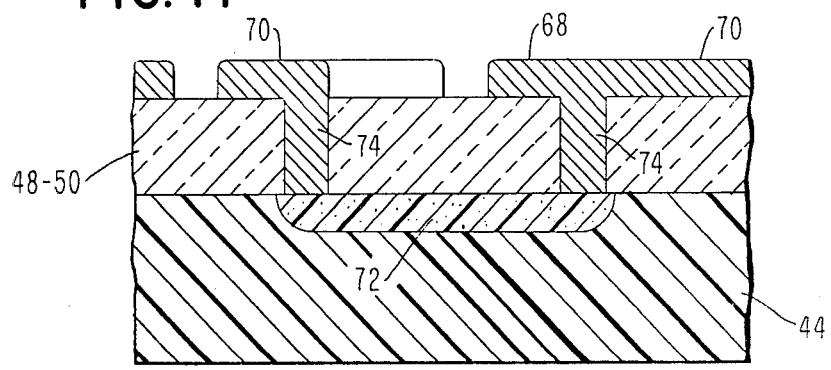

Co-pending application Ser. No. 537,219 filed on even date herewith is concerned with how splitting of the arrays, decoders and lines increases the circuit density in logic arrays. In accordance with the present invention the external connections to the inputs and outputs of the arrays can be personalized in accordance with the functions to be performed in the array. To this end, a plurality of vertical rails 62 are provided on the chip on each side of the arrays 10, 12 and 14. Arranged orthogonally with respect to these rails 62 are the inputs 18 to the decoder 16, the outputs 66 of the JK's and the inputs 688 of the off chip drivers 66. As shown in FIGS. 7, 10 and 11 the input lines 18 and 68 and the output lines 67 are metallized patterns on the surface of the oxidation layer 48–50 of the chip. The rails 62 are each made up of alternating metal portions 70 on top of the oxidation layer 48–50 and diffused portions 72 in the substrate 44 of the chip. These are joined by metallized via holes 74 that pass through the oxidation layer 48–50. The diffused portions 72 are located opposite the off chip drivers 66, the decoders 16 and the latches 30 so that the lines to the drivers, latches and decoders can pass over the diffused portions of certain of the rails 62 and be connected to metallized portions of other of the rails. The rails are segmented by openings 76 in the metal portions 70 to electrically isolate two or more different signals contained on the same rail on electrically isolated segments of the same rail. For instance, suppose JK 30a is to be connected to the off chip driver 66a, the metal lines 67 and 68 are connected to opposing metal portions 70a and 70b of the same rail 62a. The metal lines 67 and 68 pass over the diffused portions 72 of the other rails 62 so they do not short the rails together. Furthermore, the metallized portions 70a and 70b of rail 62a both contain an opening to isolate the segment of rail 62a containing the connection between the JK 30a and the off chip driver 66a from the remainder of the rail 62a so that the remainder of the rail can be used to carry other signals to the array such as the connection between JK 30b and the input to two-bit decoder 16b. It should be noted that the inputs to the decoders 16 are positive and the outputs of the JK's are also positive so the outputs of the JK 30a can be directly connected back to the decoder 16b permitting sequential logic to be performed with the arrays 10, 12, 14 and the JK's 30 without the use of off chip connections between the JK's and the decoders. Connected across the top of the chip and bottom of the chip are a number of pads 74a which function exclusively as input pads for input signals onto the chip to be fed to the inputs of the decoders 16. They are connected to the rails 62 by a metallization pattern determined by the functions to be performed on the chips. The pads 74a along the side of the chip may be used either as output pads or input pads. If they are used as output pads they are connected by metal personalization 76 to one of the off chip drivers 66. If they are used as input pads, they like pads on the bottom and top of the array and are connected by personalization directly to the rails 62. The off chip drivers are simple amplifiers such as a single stage grounded source FET amplifier.

While the invention has been particularly shown and described with reference to preferred embodiments thereof, it will be understood by those skilled in the art that the above and other changes in form and details may be made therein without departing from the spirit and scope of the invention.

What is claimed is:

1. In a programmable logic array chip comprising at least two arrays and a string of latches in which one of the arrays receives interrogation signals from decoders and feeds the response thereto to the second array which in turn supplies inputs to the latches, an arrangement for the supplying of inputs to the decoders and receiving of outputs from the latches comprising:
    connections to the inputs of the decoders and the outputs of the latches extending in a side by side relationship; and
    a series of colinear rails crossing the connections to form a grid of intersecting connections, individual rails being electrically coupled to certain of the connections and electrically isolated from others and having breaks therein which divide the rails into segments so that signals on different segments of the same rail are electrically isolated from one another.

2. The array logic chip of claim 1 including;
    output connections for carrying outputs of the arrays off the chip located side by side with the connections to the latches.

3. The array logic chip of claim 2 wherein;
    one of said output connection is electrically joined to the same segment of a rail as the connections to a latch at different points along the length of the segment.

4. The array logic chip of claim 1 wherein said monolithic chip has a substrate with an oxide layer formed thereon.

5. The array logic chip of claim 4 wherein each of said rails comprises alternating metal portions formed on the surface of the oxide layer and conductive diffusions in the substrate that are joined through the oxide layer by conductive vias, the connections are metal lines formed on the surface of the oxide layer so that they are electrically connected to a metal portion of one rail and at least some of them pass over the conductive diffusions of other rails.

6. The array logic chip of claim 5 wherein said decoders and latches are located on one side of said rails and said chip drivers are located on the other side of the rails.

7. The array logic chip of claim 5 wherein said breaks in the rails are openings in the metal portions of the rails.

8. The array logic chip of claim 7 including off chip drivers coupled to output connectors for amplifying the output signals of the latches.

* * * * *